(12) United States Patent
Sakakibara et al.

(10) Patent No.: US 6,583,745 B2
(45) Date of Patent: Jun. 24, 2003

(54) A/D CONVERTER

(75) Inventors: Kazuo Sakakibara, Tokyo (JP); Minoru Takeuchi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 66 days.

(21) Appl. No.: 09/760,803

(22) Filed: Jan. 17, 2001

(65) Prior Publication Data

US 2002/0008654 A1 Jan. 24, 2002

(30) Foreign Application Priority Data

Jul. 24, 2000 (JP) ........................................ 2000-222655

(51) Int. Cl.[7] ................................................ H03M 1/12
(52) U.S. Cl. ........................ 341/155; 341/164; 341/108
(58) Field of Search .............................. 341/108, 155, 341/161, 159, 164, 141

(56) References Cited

U.S. PATENT DOCUMENTS

| | | | | |
|---|---|---|---|---|
| 4,454,500 A | * | 6/1984 | Kato et al. ................... | 341/108 |
| 5,331,324 A | * | 7/1994 | Nakajima ..................... | 341/141 |
| 5,585,796 A | * | 12/1996 | Svensson et al. ............ | 341/155 |
| 5,619,201 A | * | 4/1997 | Imakura ....................... | 341/141 |
| 5,877,719 A | * | 3/1999 | Matsui et al. ................ | 341/155 |
| 6,181,268 B1 | * | 1/2001 | Miyake et al. ............... | 341/161 |
| 6,181,269 B1 | * | 1/2001 | Nishiuchi et al. ........... | 341/164 |
| 6,239,734 B1 | * | 5/2001 | Bae et al. ..................... | 341/164 |
| 6,304,203 B1 | * | 10/2001 | Yamada ....................... | 341/159 |

FOREIGN PATENT DOCUMENTS

| | | |
|---|---|---|
| JP | 58-12424 | 1/1983 |
| JP | 4-7914 | 1/1992 |
| JP | 10-145196 | 5/1998 |

* cited by examiner

*Primary Examiner*—Jean Bruner JeanGlaude
(74) *Attorney, Agent, or Firm*—Burns, Doane, Swecker & Mathis, LLP

(57) ABSTRACT

An A/D converter has a successive approximation register having a plurality of A/D registers each corresponding to one of A/D inputs. A capacitor in a comparator is charged by a voltage determined based on a value held in an A/D register corresponding to an A/D input to be A/D converted before starting A/D conversion of the A/D input, thereby reducing noise generated at the time of selecting A/D inputs to enhance A/D conversion accuracy.

11 Claims, 7 Drawing Sheets b0: SWITCH 18
b1: SWITCH 19
b2: SWITCH 4
b3: SWITCH 5
b4: SWITCH 3
b5: SWITCH 12
b6: SWITCH 13
b7: ---------

1: ON
0: OFF

A/D CONVERTER

BACKGROUND OF THE INVENTION

1. Field of the Invention

The present invention relates to an A/D converter incorporated in a single-chip microcomputer and the like.

2. Description of the Prior Art

FIG. 9 is a block diagram showing an A/D converter using a conventional sequential conversion method. In FIG. 9, reference numeral 1 denotes a capacitor; 2 indicates an inverter connected in series to the capacitor 1; 3, 4, and 5 each denote switches for controlling charging/discharging of the capacitor 1; and 6 denotes a comparator composed of the components described above. Reference numeral 7 indicates a successive approximation register for sequentially holding the output of the comparator 6; 8 denotes a ladder resistor composed of a plurality of resistors connected in series for dividing a reference voltage VREF and generating various comparison voltages while 9 denotes a decoder for selecting from comparison voltages generated by the ladder resistor 8. A combination of the ladder resistor 8 and the decoder 9 functions as a D/A converter for converting digital data from the successive approximation register 7, into analog voltages. Reference numeral 10 indicates an input terminal for receiving the first A/D input while 11 indicates an input terminal for receiving the second A/D input; 12 and 13 each denote a switch for selecting the A/D inputs; and 14 denotes a selection circuit composed of the switches 12 and 13; 15 denotes an A/D control circuit for controlling the comparator 6, the successive approximation register 7, and the input selection circuit 14 described above.

Next, the operation of the A/D converter will be described.

In the sampling mode, the A/D control circuit 15 controls the input selection circuit 14 so that the switch 12 is turned ON and the switch 13 is turned OFF in order to charge the capacitor 1 by the first A/D input applied to the input terminal 10. At that time, in the comparator circuit 6, the switch 4 is OFF while the switches 5 and 3 are ON. Then, the A/D converter assumes the hold mode in which the switch 12 is turned OFF to disconnect the first A/D input and hold the charge voltage of the capacitor 1 for a certain period of time. During this period, the comparator 6 turns ON the switch 4 and turns OFF the switches 5 and 3 so as to receive a comparison voltage from the decoder 9 and compares it with the charge voltage of the capacitor 1. This comparison voltage is sequentially changed to perform first A/D conversion of the first A/D input applied to the input terminal 10.

After the A/D conversion of the first A/D input has been completed, the switch 4 is turned OFF and the switches 5 and 3 are turned ON in the comparator 6 while the switch 12 is turned OFF and the switch 13 is turned ON in the input selection circuit 14, so as to charge the capacitor 1 by the second A/D input applied to the input terminal 11. Then, the switch 13 is turned OFF to disconnect the second A/D input and hold the charge voltage of the capacitor 1 for a certain period of time. During this period, the comparator 6 turns ON the switch 4 and turns OFF switches 5 and 3, and compares a comparison voltage received[0a‰o6]rom the decoder 9 with the charge voltage of the capacitor 1. Thus, first A/D conversion of the second A/D input applied to the input terminal 11 is performed.

The second and later conversions of the first and second A/D inputs are performed in the same way as that described above, that is, by sequentially selecting the switches 12 and 13 of the input selection circuit 14, and the switches 4, 5, and 3 of the comparator 6 so as to sample and hold the first and the second A/D inputs alternately. Thus, in the scan mode, a plurality of A/D inputs are converted into digital data by a single A/D converter using a time-division method.

Incidentally, conventional A/D converters as explained above are described in, for example, JP-A Nos. 4-7914 (1992), 10-145196 (1998), and 58-12424 (1983).

Since the conventional A/D converter is configured as described above, when the sample/hold functions are used in the scan mode, an electric charge on the capacitor 1 is discharged to the line to the input terminal 11 at the time of selection from the first A/D input (on line 10) to the second A/D input (on line 11), which produces noise onto the line connecting between the input selection circuit 14 and the switch 5 of the comparator 6, thereby lowering A/D conversion accuracy in an A/D converter incorporated in a single-chip microcomputer.

SUMMARY OF THE INVENTION

The present invention is implemented to solve the foregoing problem. It is therefor an object of the present invention to provide an A/D converter capable of reducing noise produced at the time of selection from the first A/D input to the second A/D input so as to enhance A/D conversion accuracy.

According to one aspect of the present invention, there is provided an A/D converter such that a successive approximation register has a plurality of A/D registers each corresponding to one of the A/D inputs, and that A/D conversion of an A/D input is controlled after the capacitor in a comparator is charged by a voltage determined based on a value held by the A/D register corresponding to the A/D input to be A/D converted.

Here, A/D conversion of an A/D input may be performed after the capacitor in a comparator is charged by a voltage corresponding to a previous A/D conversion value held by the corresponding A/D register.

First A/D conversion of an A/D input may be performed after the capacitor in a comparator is charged by a half of a reference voltage determined based on a value held by the corresponding A/D register.

When the capacitor in a comparator is charged, parasitic capacitances may be also charged at the same time.

A/D conversion of an A/D input may be initiated a predetermined period of time after the capacitor in a comparator is charged by the A/D input voltage.

A time adjustment register may be provided in which time taken before A/D conversion is initiated is set.

A/D conversion of an A/D input may be initiated after charging parasitic capacitances.

Each switch employed may be controlled according to data set in a wiring connection selection register, and further A/D conversion may be initiated after charging wiring determined as a result of the control.

DETAILED DESCRIPTION OF THE PREFERRED EMBODIMENTS

An embodiment of the present invention will be described below.

EMBODIMENT 1

Figure 1:
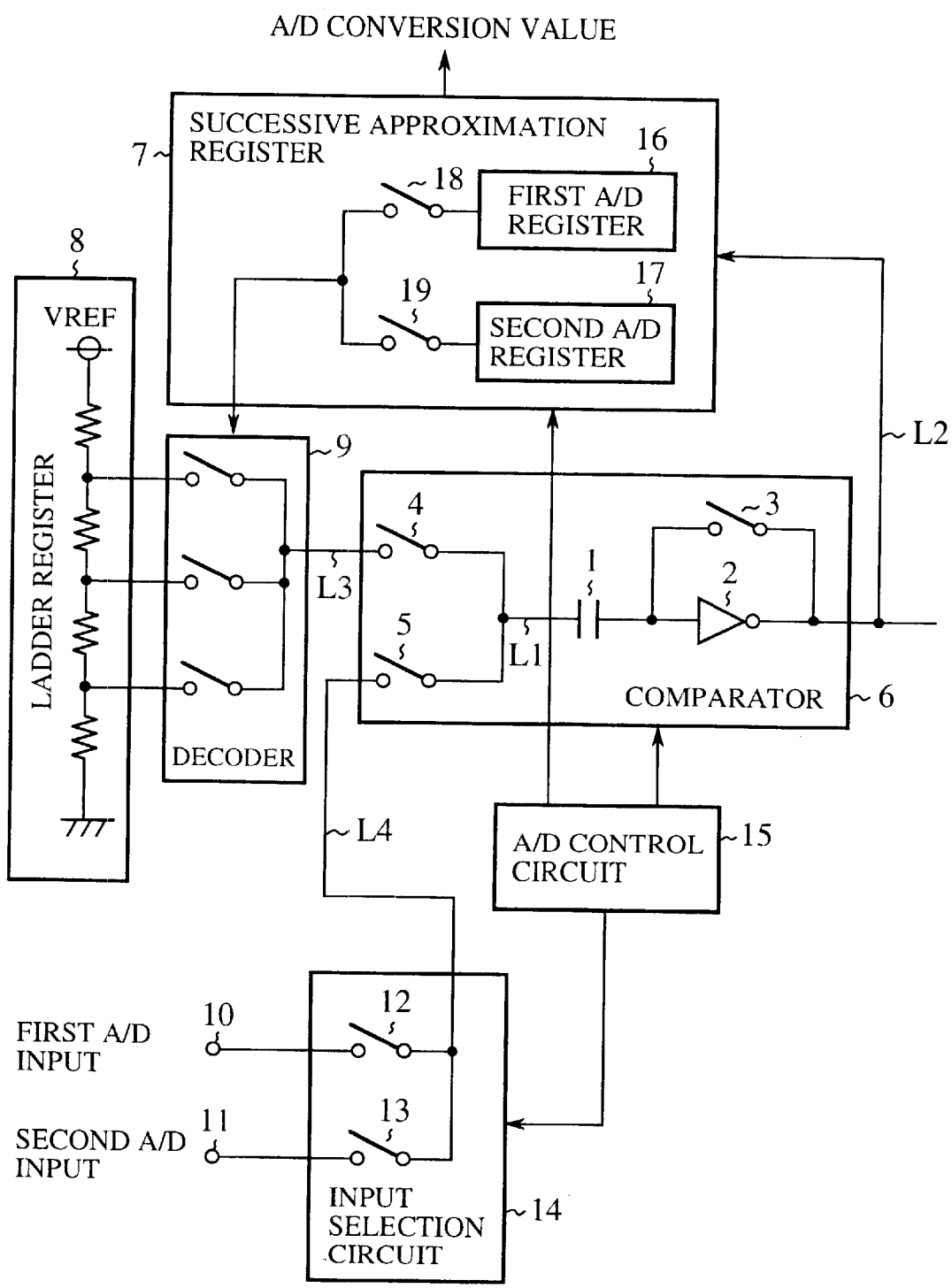
FIG. 1 is a block diagram showing the configuration of an A/D converter according to a first embodiment of the present invention.

FIG. 1 is a block diagram showing an A/D converter using a sequential conversion method according to the first embodiment of the present invention. In FIG. 1, reference numeral 1 denotes a capacitor, while 2 denotes an inverter connected in series to the capacitor 1; 3 denotes a switch for connecting between the output and input of the inverter 2; and 4 and 5 each indicate a switch for selecting between the two inputs of the capacitor 1. These switches 4 and 5 are connected to the capacitor 1 through a line L1. Reference numeral 6 denotes a chopper type comparator composed of the capacitor 1, the inverter 2, the switches 3 through 5 for comparing a comparison voltage with an analog signal to be A/D converted (A/D input).

Reference numeral 7 indicates a successive approximation register for holding data fed from the comparator 6 through a line L2, and controlling a decoder, described later, based on the data; 8 denotes a ladder resistor which is composed of resistors connected in series, and whose one end is connected to the ground while the other is connected to a reference voltage VREF, in order to divide the reference voltage VREF and thereby generate a plurality of comparison voltages to the comparator 6; and 9 indicates a decoder for outputting a comparison voltage selected from the comparison voltages generated by the ladder resistor 8 corresponding to an output value from the successive approximation register 7. The ladder resistor 8 and the decoder 9 combine to function as a D/A converter for converting digital data held by the successive approximation register 7, into analog voltages. A comparison voltage from the decoder 9 is input to the switch 4 of the comparator 6 through a line L3.

Figure 9:
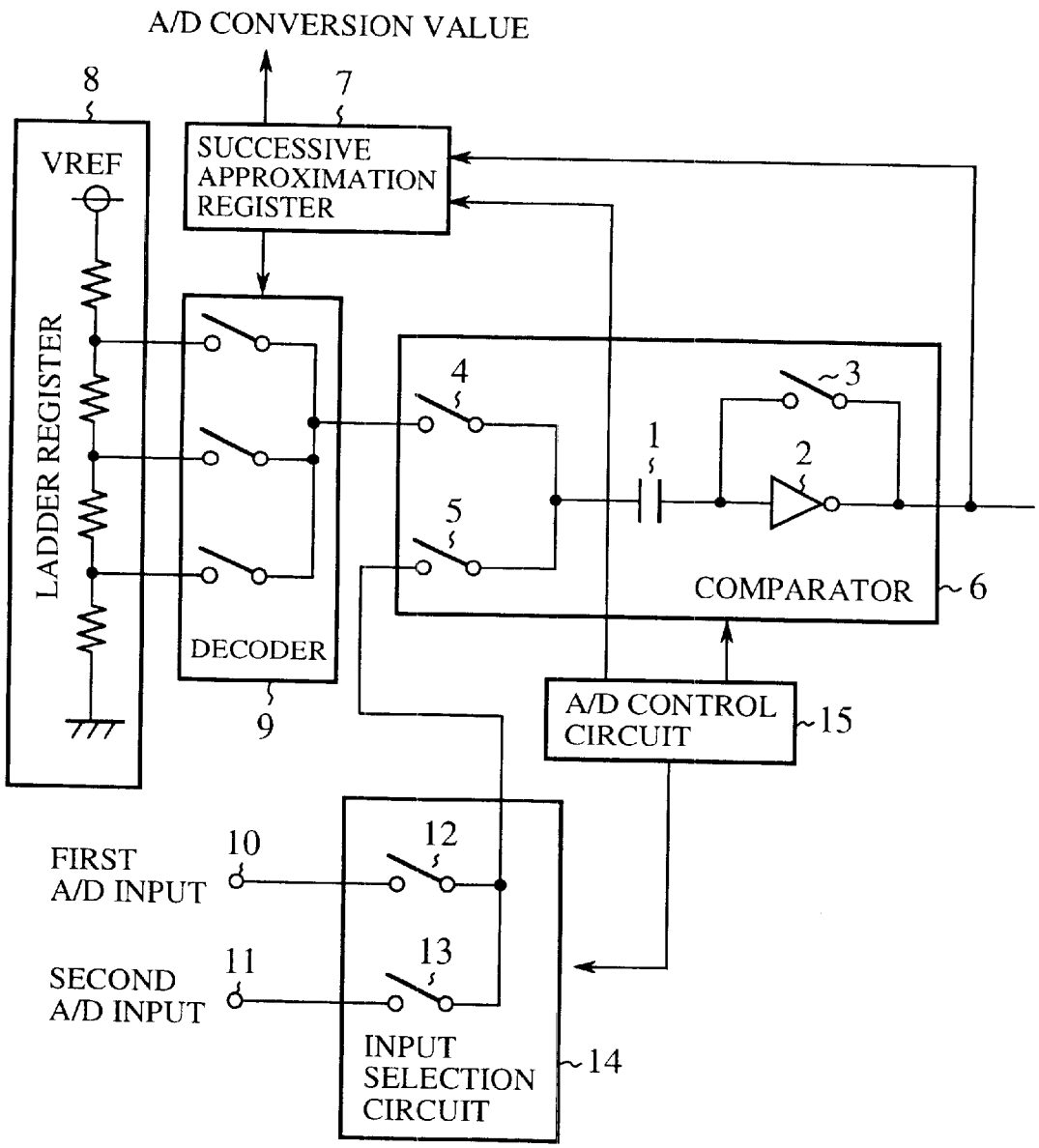
FIG. 9 is a block diagram showing the configuration of a conventional A/D converter.

Reference numeral 10 denotes an input terminal for receiving the first A/D input to be A/D converted, and similarly, 11 denotes an input terminal for receiving the second A/D input. Reference numeral 12 indicates a switch for selecting the input terminal 10 to which the first A/D input is applied, and similarly, 13 indicates a switch for selecting the input terminal 11 to which the second A/D input is applied. Reference numeral 14 denotes an input selection circuit composed of the switches 12 and 13 for selecting between the first and the second A/D inputs and thereby selecting one of them, and outputting it to the comparator 6 through a line L4; and 15 indicates an A/D control circuit for controlling the comparator 6, the successive approximation register 7, and the input selection circuit 14. It should be noted that the components described above are each equivalent to that with a like numeral of the conventional A/D converter shown in FIG. 9.

In the successive approximation register 7, reference numeral 16 denotes a first A/D register corresponding to the first A/D input applied to the input terminal 10 to hold data fed from the comparator 6 during A/D conversion of the first A/D input; on the other hand, 17 denotes a second A/D register corresponding to the second A/D input applied to the input terminal 11 to hold data fed from the comparator 6 during A/D conversion of the second A/D input; and 18 indicates a switch for outputting the value of the first A/D register 16 to the decoder 9, while 19 indicates a switch for outputting the value of the second A/D register 17 to the decoder 9.

Next, description will be made of the operation of the A/D converter according to the first embodiment.

Figure 2:
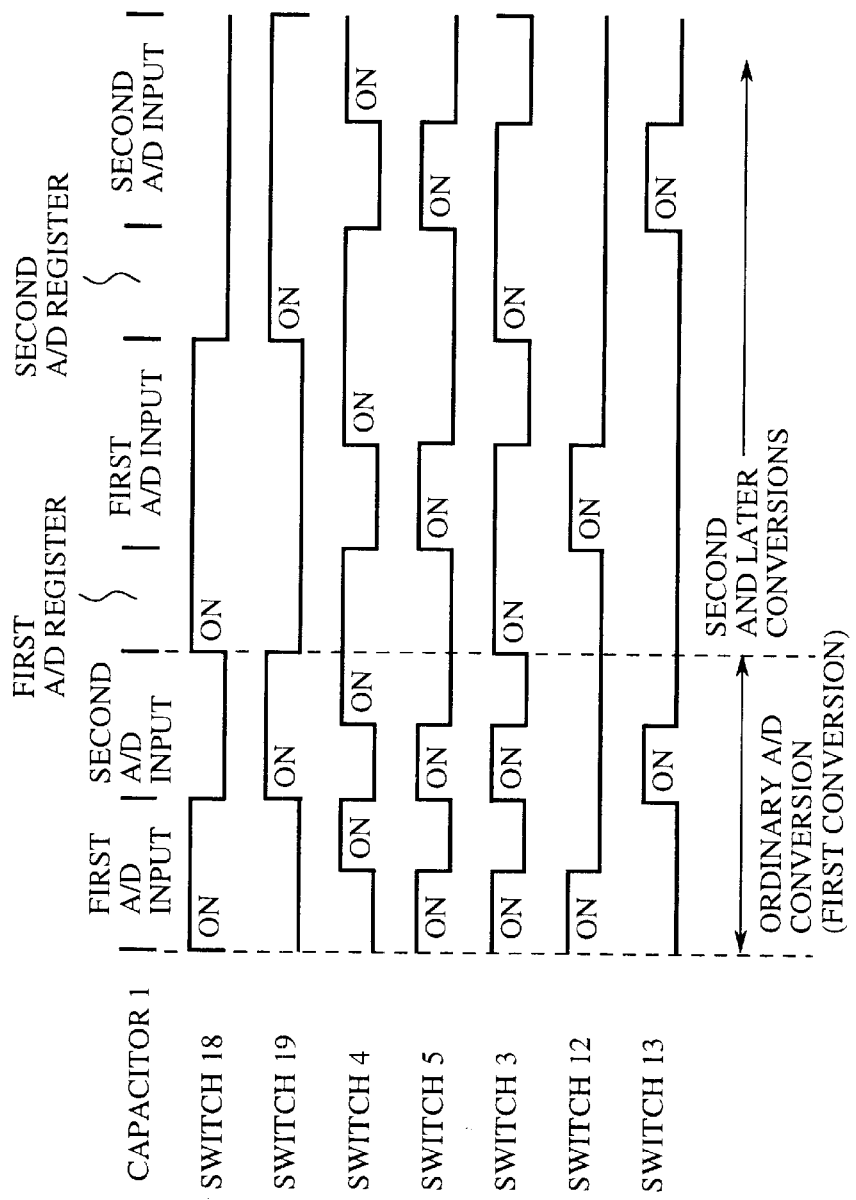
FIG. 2 is a time chart showing ON/OFF operation timings of each switch in the first embodiment of the present invention.

FIG. 2 is a time chart showing ON/OFF operation timings of the switches 18, 19, 4, 5, 3, 12, and 13 in the A/D converter according to the first embodiment of the present invention shown in FIG. 1.

The A/D converter of the first embodiment shown in FIG. 1 performs the same first A/D conversion as that by the conventional A/D converter in the scan mode carrying out sample/hold operations. That is, each switch is set as follows. The switch 12 is ON and the switch 13 is OFF in the input selection circuit 14; the switches 5 and 3 are ON and the switch 4 is OFF in the comparator 6; and the switch 18 is ON and the switch 19 is OFF in the successive approximation register 7. With this setting, the capacitor 1 is charged by the first A/D input voltage applied to the input terminal 10.

At that time, the first A/D register 16 is holding an initial value (80H), and is connected to the decoder 9 by the switch 18 to control it. Based on the initial value (80H) of the first A/D register 16, the decoder 9 selects the middle voltage (½ VREF) of a reference voltage VREF output from the ladder resistor 8, as a comparison voltage, and outputs it to the comparator 6 through the line L3. Then, the switch 12 is turned OFF in the input selection circuit 14; and the switches 5 and 3 are turned OFF, and the switch 4 is turned ON in the comparator 6. Accordingly, the comparison voltage fed from the decoder 9 to the comparator 6 through the line L3 is applied to the capacitor 1 through the switch 4 and the line L1.

Here, if this comparison voltage is higher than the charge voltage of the capacitor 1, a "H" level signal is output from the capacitor 1 to the inverter 2 which in turn outputs the inverted signal, that is, a "L" level signal. This signal is fed to the successive approximation register 7 through the line L2 as an output from the comparator 6. When the successive approximation register 7 has received the signal, a value of C0H is set in its first A/D register 16 based on the output from the comparator 6. On the other hand, if the comparison voltage output from the decoder 9 to the comparator 6 is lower than the charge voltage of the capacitor 1, a "L" level signal is output from the capacitor 1 to the inverter 2, and thereby a "H" level signal is fed to the successive approximation register 7 through the line L2. Based on the output from the comparator 6, a value of 40H is set in the first A/D register 16.

After that, the comparator 9 sequentially compares each comparison voltage obtained by D/A converting the value set in the first A/D register 16 by use of the ladder resistor 8 and the decoder 9, against the first AID input voltage applied to the input terminal 10, using the capacitor 1 in order to obtain the first A/D conversion value of the first A/D input.

After the first A/D conversion of the first A/D input has been thus completed, each switch of the A/D converter is set as follows. The switch 12 is turned OFF while the switch 13 is turned ON in the input selection circuit 14; the switches 5 and 3 are turned ON while the switch 4 is turned OFF in the comparator 6; and the switch 18 is turned OFF while the switch 19 is turned ON in the successive approximation register 7. Accordingly, the capacitor 1 is charged by the second A/D input voltage applied to the input terminal 11. At that time, the second A/D register 17 is also holding an initial value of 80H, and as a comparison voltage, the decoder 9 outputs-to the comparator 6 the middle voltage of a reference voltage obtained by D/A converting the initial value (80H) of the second A/D register 17 by use of the ladder resistor 8 and the decoder 9.

Then, the switch 13 is turned OFF in the input selection circuit 14; and the switches 5 and 3 are turned OFF, and the switch 4 is turned ON in the comparator 6. Accordingly, the comparison voltage fed from the decoder 9 to the comparator 6 is applied to the capacitor 1. If this comparison voltage is higher than the charge voltage of the capacitor 1, a "H" level signal is output from the capacitor 1 to the inverter 2, while if this comparison voltage is lower than the charge voltage, a "L" level signal is output. The inverter 2, in turn, outputs the inverted signal to the successive approximation register 7 through the line L2. Upon receiving this signal, the successive approximation register 7 sets a value of C0H or 40H in the second A/D register 17 depending on the received signal.

After that, the comparator 9 sequentially compares each comparison voltage obtained by D/A converting the value set in the second A/D register 17 by use of the ladder resistor 8 and the decoder 9, against the second A/D input voltage applied to the input terminal 11, using the capacitor 1 in order to obtain an A/D conversion value of the second A/D input.

After the first A/D conversions of both the first A/D input and the second A/D input have been thus completed, the second A/D conversion of the first A/D input and the second A/D conversion of the second A/D input are initiated in that order. It should be noted that the A/D control circuit 15 controls turning ON/OFF of the switches 18, 19, 4, 5, 3, 12, and 13.

Before carrying out the second conversion of the first A/D input, the switch 18 is turned ON and the switch 19 is turned OFF in the successive approximation register 7. The decoder 9 reads out a value set in the first A/D register 16 through the switch 18, and selects a comparison voltage corresponding to the read value from the ladder resistor 8 and outputs the comparison voltage to the comparator 6 through the line L3. When the switches 4 and 3 are turned ON and the switch 5 is turned OFF in the comparator 6, the capacitor 1 is charged by the comparison voltage which is applied from the decoder 9 through a route formed of the line L3, the switch 4, and the line L1, and which corresponds to the value set in the first A/D register 16. Then, the switch 12 in the input selection circuit is turned ON to perform the same A/D conversion as the first A/D conversion (ordinary A/D conversion) on the first A/D input.

Here, since the value set in the first A/D register 16 is the first A/D conversion value of the first A/D input, the charge voltage of the capacitor 1 is close to the current first A/D input voltage. Accordingly, immediately after the switches 12, 5, and 3 have been turned ON to perform the second A/D conversion of the first A/D input, the potential between the first A/D input and the capacitor 1 is small. Thus, since the switch 12 in the selection circuit 14 is turned ON after the capacitor 1 has been charged by a voltage corresponding to the first A/D conversion result, noise generated due to the difference between the first A/D input voltage and the charge voltage of the capacitor 1 immediately after selecting the inputs is small.

After the second A/D conversion of the first A/D input has been completed, the switch 19 is turned ON and the switch 18 is turned OFF in the successive approximation register 7 to output to the comparator 6 a comparison voltage corresponding to a value set in the second A/D register 17 before performing the second conversion of the second A/D input, as in the case described above. In the comparator 6, the switches 4 and 3 are turned ON, and the switch 5 is turned OFF to charge the capacitor 1 to a voltage corresponding to the value set in the second A/D register 17. After that, the same A/D conversion as the first A/D conversion (ordinary A/D conversion) is performed on the second A/D input. Then, by repeating the above processing for the third and later conversions, the first A/D inputs and the second A/D inputs are sequentially A/D converted one by one.

According to the first embodiment, as described above, since A/D conversion is performed after the capacitor 1 has been charged to a voltage corresponding to a value held in the A/D register 16 or 17, it is possible to reduce noise produced at the time of selection of inputs, resulting in enhanced accuracy of A/D conversion.

EMBODIMENT 2

In the above first embodiment, before the second or later A/D conversion is performed, the capacitor 1 is charged by a voltage which is obtained as a result of the previous A/D conversion and held by the A/D register 16 or 17. However, before the first A/D conversion is performed, the capacitor 1 may be charged by a voltage of ½ VREF as described below in a second embodiment of the present invention. An A/D converter of the second embodiment is configured the same as that of the first embodiment shown in FIG. 1.

Next, description will be made of the operation of the A/D converter according to the second embodiment.

Figure 3:
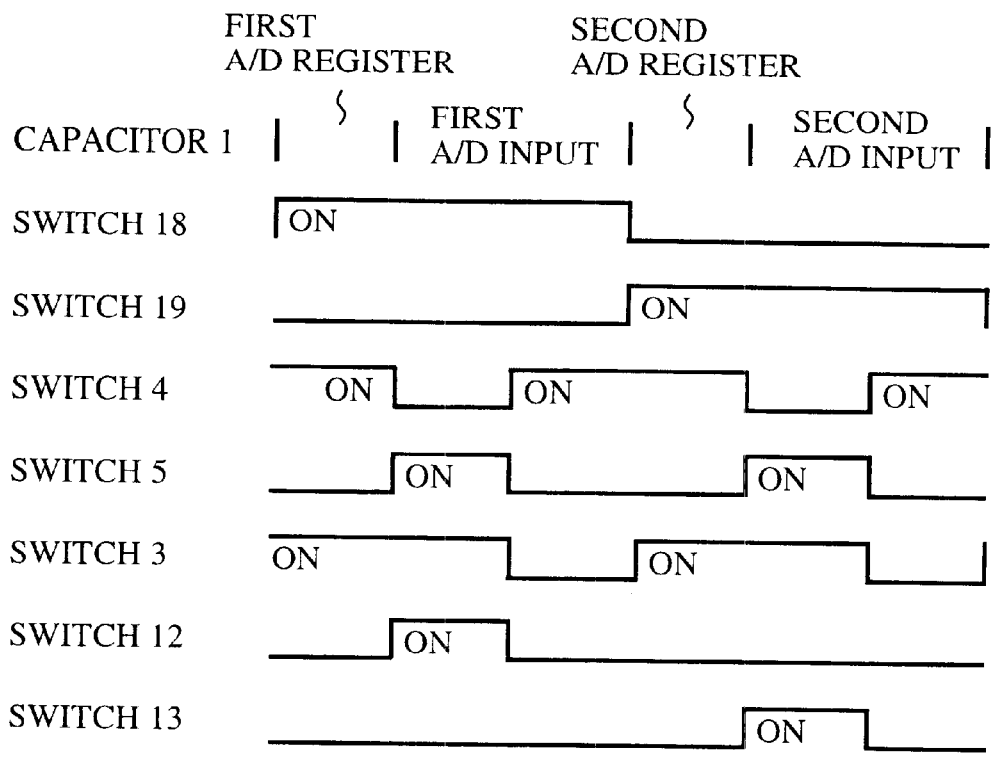
FIG. 3 is a time chart showing ON/OFF operation timings of each switch in a second embodiment of the present invention.

Here, FIG. 3 is a time chart showing ON/OFF operation timings of each switch of the A/D converter shown in FIG. 1.

First, a value of 80H is set in both the first A/D register 16 and the second A/D register 17 beforehand as an initial value. Before starting first A/D conversion of the first A/D input applied to the input terminal 10, the following switches are set. The switch 18 is turned ON and the switch 19 is turned OFF in the successive approximation register 7; and the switches 4 and 3 are turned ON and the switch 5 is turned OFF in the comparator 6. With this setting, the initial value of 80H set in the first A/D register 16 is DIA converted by a combination of the ladder resistor 8 and the decoder 9 into a voltage of ½ VREF, and fed to the capacitor 1 through the line L3, the switch 4, and the line L1 to charge the capacitor 1. Thus, before the first A/D conversion is performed, the capacitor 1 is charged by a voltage of ½ VREF. At that time, the switches 12 and 13 of the input selection circuit 14 are both turned OFF.

Then, actual A/D conversion operation of the first A/D input is initiated. At that time, the switch 4 is turned OFF, while the switches 5 and 13 are turned ON. Accordingly, the voltage of the capacitor 1 is changed from ½ VREF to the first A/D input voltage applied to the input terminal 10. Here, consider the case in which the capacitor 1 is not initially charged to a voltage of ½ VREF (that is, a voltage of 0 volt on the capacitor 1, for example). In this case, the potential between the first A/D input and the capacitor 1 is a maximum of VREF, and, therefore, when the capacitor 1 is charged by the first A/D input voltage, noise is produced by the large potential difference. However, in this embodiment, since the capacitor 1 is charged to a voltage of ½ VREF beforehand, when the capacitor 1 is charged by the first A/D input voltage, the potential difference is ½ VREF at most, suppressing generation of noise by the reduction in potential difference.

After the first A/D conversion of the first A/D input has been completed, the switch 18 is turned OFF and the switches 13 and 19 are turned ON to perform the first A/D conversion of the second A/D input as in the above A/D conversion of the first A/D input. After the first A/D conversion of the second A/D input has been completed, the second and later A/D conversions of the first A/D input and the second A/D input are carried out alternately one by one. It should be noted that the ordinary A/D conversion operation is performed for the second and later conversions.

As described above, since this second embodiment charges the capacitor 1 by a voltage of ½ VREF before performing a first A/D conversion, and thereby limits the maximum potential difference to ½ VREF at the time of charging the capacitor 1, it is possible to suppress generation of noise, resulting in enhanced accuracy of A/D conversion.

EMBODIMENT 3

The above first embodiment gives no consideration to parasitic capacities. However, the entire capacitances including parasitic capacitances may be charged at the time of charging the capacitor 1 as described below in a third embodiment of the present invention. An A/D converter of the third embodiment is also configured the same as that of the first embodiment shown in FIG. 1.

Next, description will be made of the operation of the A/D converter according to the third embodiment.

Figure 4:
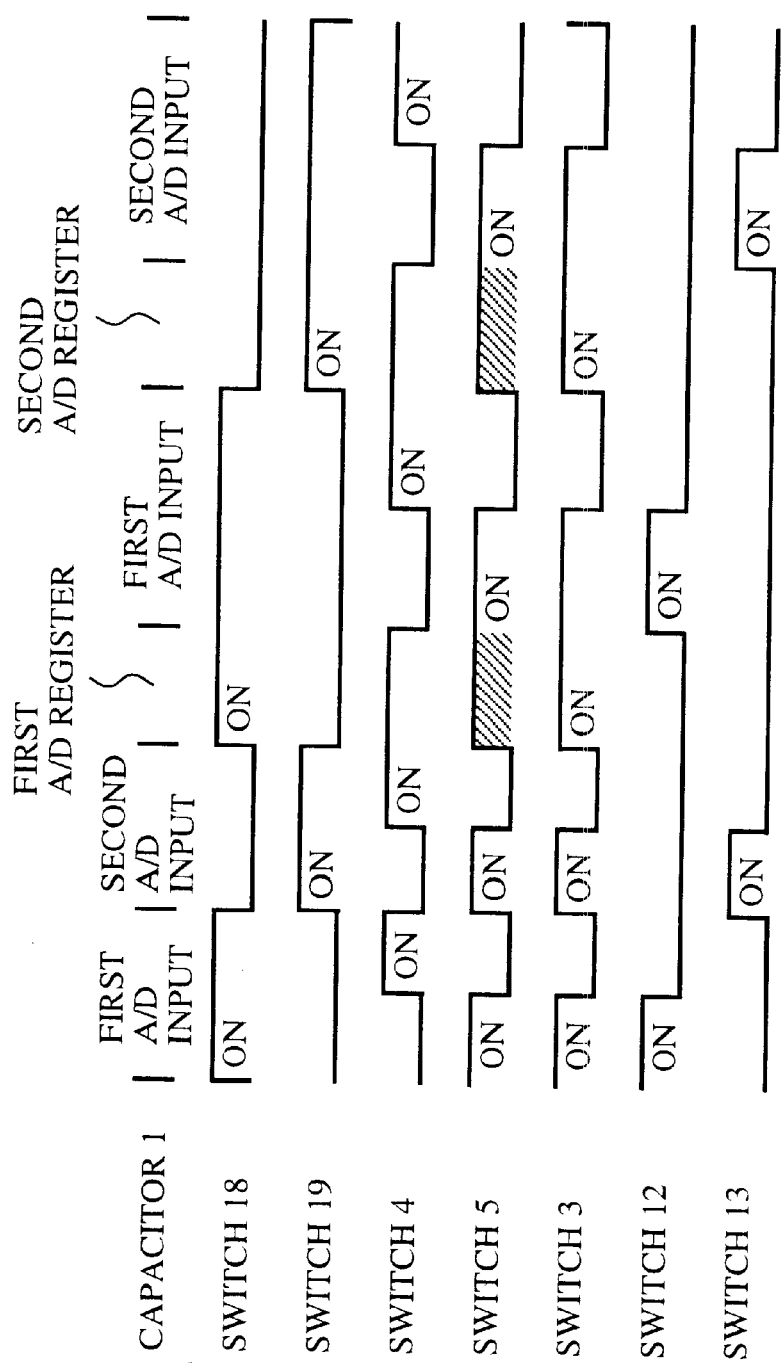
FIG. 4 is a time chart showing ON/OFF operation timings of each switch in a third embodiment of the present invention.

Here, FIG. 4 is a time chart showing ON/OFF operation timings of each switch of the A/D converter shown in FIG. 1. It should be noted that the basic operation is the same as that of the first embodiment.

When the first A/D input is A/D converted, the capacitor 1 is initially charged by a voltage determined based on a value which is obtained as a result of the previous A/D conversion and is set in the first A/D register 16 in the successive approximation register 7. At that time, the switches 5 and 4 in the comparator 6 are simultaneously turned ON as indicated by a hatched portion in FIG. 4. By turning ON the switch 5 at the same time with the switch 4 in an operation to charge the capacitor 1 by the voltage corresponding to the value of the first A/D register 16, it is possible to charge the wiring area of the line L4 from the input selection circuit 14 to the comparator 6. It should be noted that at that time, the switches 12 and 13 are set so that both switches are OFF in the input selection circuit 14. With this setting, charging of the capacitor 1 as well as charging of parasitic capacitances in the wiring area of the line L4, etc. are carried out. After that, the switch 4 in the comparator 6 is turned OFF and the switch 12 in the input selection circuit 14 is turned ON to A/D convert the first A/D input as in the case of the first embodiment.

After the first A/D input has been converted, the conversion of the second A/D input is carried out in the same way. In this case also, the switches 5 and 4 in the comparator 6 are simultaneously turned ON, and the switches 12 and 13 in the input selection circuit 14 are turned OFF so as to charge the capacitor 1 as well as parasitic capacitances in the wiring area of the line L4, etc. Then, the switch 4 of the comparator 6 is turned OFF and the switch 13 of the input selection circuit 14 is turned ON to A/D convert the second A/D input as in the case of the first embodiment. For later conversions, the first A/D inputs and the second A/D inputs are A/D converted alternately one by one using the procedure as described above.

As described above, in the third embodiment, when the capacitor 1 is charged, parasitic capacitances are also charged at the same time. Therefore, the wiring area of the line L4, from the input selection circuit 14 to the comparator 6, has a voltage close to the A/D input, making it possible to reduce noise generated at the time of switching between the input terminals 10 and 11, and thereby enhancing A/D conversion accuracy.

EMBODIMENT 4

The above embodiments give no consideration to time taken from completion of charging of the capacitor 1 to initiation of A/D conversion. However, if A/D conversion is initiated after the voltage of the line L4, from the input selection circuit 14 to the comparator 6, has become stable, the accuracy of the A/D conversion will be further enhanced as described below in a fourth embodiment. An A/D converter of the fourth embodiment is also configured the same as that of the first embodiment shown in FIG. 1.

Next, description will be made of the operation of the A/D converter according to the fourth embodiment.

Figure 5:
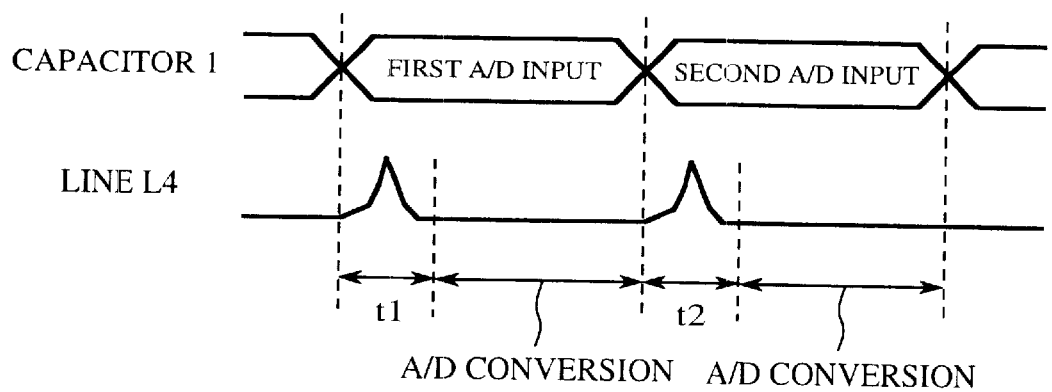
FIG. 5 is a time chart showing A/D conversion operation timings in a fourth embodiment of the present invention.

Here, FIG. 5 is a time chart showing A/D conversion operation timings of an A/D converter according to the fourth embodiment. It should be noted that the basic operation is the same as that of the first embodiment.

Referring to the block diagram in FIG. 1, the switch 12 is turned ON and the switch 13 is turned OFF in the input selection circuit 14, and the switches 5 and 3 are turned ON and the switch 4 is turned OFF in the comparator 6. With this setting, the capacitor 1 is charged by the first A/D input. Here, as shown in FIG. 5, noise remains on the line L4, from the input selection circuit 14 to the comparator 6, immediately after the capacitor 1 has been charged by the first A/D input voltage. To cope with this problem, the A/D conversion is initiated after the voltage of the line L4 has been stabilized. Specifically, the A/D conversion is started after time (t1) taken for the voltage of the line L4 to stabilize. It should be noted that the A/D control circuit 15 performs delay control of time t1.

After A/D conversion of the first A/D input has been completed, the switch 12 is turned OFF and the switch 13 is turned ON in the input selection circuit 14. At that time, the switches 5 and 3 are ON and the switch 4 is OFF in the comparator 6, as in the above case. With this setting, the capacitor 1 is charged by the second A/D input. Here also, noise remains on the line L4 immediately after the capacitor 1 has been charged. To cope with this, the A/D conversion is initiated after time (t2) taken for the voltage of the line L4 to stabilize. It should be noted that the A/D control circuit 15 performs delay control of time t2 as in the case of time t1.

As described above, in the fourth embodiment, A/D conversion is performed after the voltage of the line L4 has become stable, eliminating the possibility of A/D converting noise left on the line L4 and thereby enhancing A/D conversion accuracy.

EMBODIMENT 5

Figure 6:
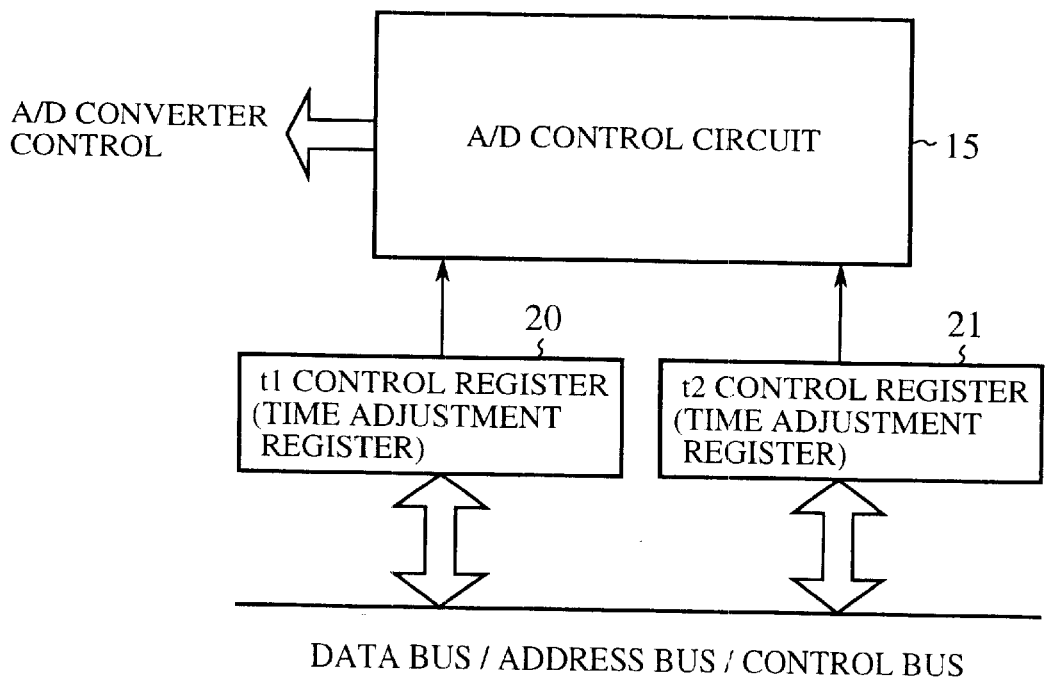
FIG. 6 is a block diagram showing the arrangement of time adjustment registers in a fifth embodiment of the present invention.

In the above fourth embodiment, the A/D control circuit 15 performs delay control using fixed values for time t1 and time t2. However, it may be arranged such that these times t1 and t2 can be externally set. FIG. 6 is a block diagram showing a portion of an A/D converter for setting t1 and t2 in a fifth embodiment of the present invention implementing such arrangement. In the figure, reference numeral 15 denotes an A/D control circuit for performing delay control of times t1 and t2; 20 indicates a t1 control register used as a time adjustment register in which to set time t1 from outside the A/D converter (from microcomputer, for example); and similarly, 21 denotes a t2 control register also used as a time adjustment register in which to set time t2.

Next, description will be made of the operation of the A/D converter according to the fifth embodiment.

Here, both the t1 control register 20 and the t2 control register 21 are connected to a data bus, an address bus, and a control bus of a microcomputer, and each given an address of the microcomputer. Before the A/D converter starts A/D conversion operation, the microcomputer sets a time t1 (time which it takes for the voltage to stabilize at the time of A/D conversion of the first A/D input and whose value is supplied through the data bus) in the t1 control register 20 whose address is given through the address bus. Similarly at the same time, the microcomputer sets a time t2 (time which it takes for the voltage to stabilize at the time of A/D conversion of the second A/D input and whose value is supplied through the data bus) in the t2 control register 21 whose address is given through the address bus. It should be noted that the times t1 and t2 are each determined by calculating time it takes for the-voltage of the A/D converter to stabilize, considering its wiring outside the chip, a difference in frames, etc.

Before initiation of A/D conversion of the first A/D input, the A/D control circuit 15 reads out time t1 set in the t1 control register 20, and by employing delay control based on the read time t1, the A/D control circuit 15 starts A/D conversion of the first A/D input after the voltage of the A/D converter has become stable. At the same time when the A/D conversion of the first A/D input has been completed and before initiation of A/D conversion of the second A/D input, the A/D control circuit 15 reads out time t2 set in the t2 control register 21, and by employing delay control based on the read time t2, the A/D control circuit 15 starts A/D conversion of the second A/D input after the voltage of the A/D converter has become stable.

As described above, since the fifth embodiment can accommodate noise delayed due to wiring outside a chip, a difference in frames, etc., it is possible to enhance A/D conversion accuracy in more diverse conditions.

EMBODIMENT 6

In the third embodiment, when the capacitor 1 is charged by a comparison voltage from the decoder 9, parasitic capacitances in the wiring area of the line L4 are also charged in order to reduce noise generated at the time of selecting input terminals. However, the A/D conversion may be initiated after charging parasitic capacitances in the wiring area of the lines L3 and L1, from the decoder 9 to the capacitor 1, as described below in a sixth embodiment. An A/D converter of the sixth embodiment is also configured the same as that of the first embodiment shown in FIG. 1.

Next, description will be made of the operation of the A/D converter according to the sixth embodiment.

Figure 7:
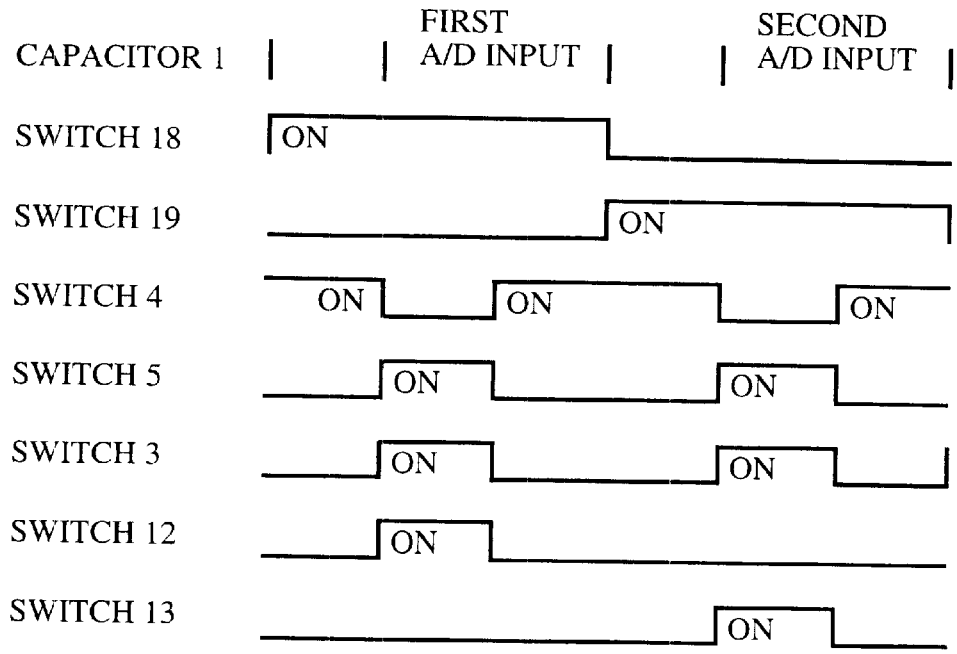
FIG. 7 is a time chart showing ON/OFF operation timings of each switch in a sixth embodiment of the present invention.

Here, FIG. 7 is a time chart showing ON/OFF operation timings of each switch of the A/D converter shown in FIG. 1. It should be noted that the basic operation is the same as that of the first embodiment.

Referring to the block diagram in FIG. 1, before initiating A/D conversion operation of the first A/D input, the switch 18 is turned ON and switch 19 is turned OFF in the successive approximation register 7, and the switch 4 is turned ON and the switches 5 and 3 are turned OFF in the comparator 6. With this setting, parasitic capacitances in the wiring area of the line L3, from the decoder 9 to the switch 4, and in the wiring area of the line 1, from the switch 4 to the capacitor 1, are charged by a voltage of ½ VREF, which is output from the decoder 9 and corresponds to an initial value (80H) set in the first A/D register 16. After the parasitic capacitances have been thus charged, the switch 4 is turned OFF and the switches 5 and 3 are turned ON in the comparator 6 while the switch 12 is turned ON in the input selection circuit 14, in order to start A/D conversion of the first A/D input. Since the potential between the first A/D input and the line L1 is small when the ordinary A/D conversion operation of the first A/D input is started, it is possible to reduce noise generated during charging of the capacitor 1 by the first A/D input voltage.

After A/D conversion of the first A/D input has been completed, the switches 19 and 4 are turned ON to charge parasitic capacitances in the wiring area of the lines L3 and L1, and then the switch 4 is turned OFF, the switches 5 and 3 are turned ON, and the switch 13 is turned ON to start A/D conversion of the second A/D input. Thus, since before starting the ordinary A/D conversion operation, parasitic capacitances in the lines L3 and L1 are charged by a voltage of ½ VREF corresponding to the initial value (80H) set in the second A/D register 17, the potential between the second A/D input and the line L1 is small when the ordinary A/D conversion operation is started, reducing noise generated during charging of the capacitor 1 by the second A/D input voltage.

As described above, in the sixth embodiment, since the voltage of the lines L1 and L3 is close to the A/D input voltages, it is possible to reduce noise generated at the time of selecting input terminals 10 and 11, enhancing A/D conversion accuracy.

EMBODIMENT 7

In the above third and fourth embodiments, parasitic capacitances in the line L2 or in the lines L3 and L1 are charged beforehand. However, lines of a high impedance may be specified so that only those lines are charged beforehand as described below in a seventh embodiment. It should be noted that an A/D converter of the seventh embodiment is also configured the same as that of the first embodiment shown in FIG. 1.

Figure 8:
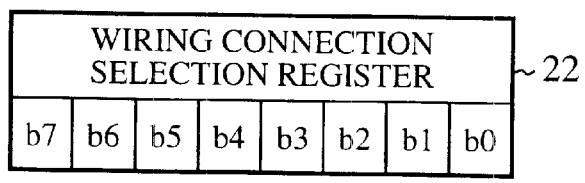
FIG. 8 is an explanatory diagram showing a wiring connection selection register according to a seventh embodiment of the present invention.

FIG. 8 is an explanatory diagram showing the bit structure of a wiring connection selection register for specifying lines to be charged in the seventh embodiment. In the figure, 22 denotes a wiring connection selection register composed of 8 bits, b0 through b7, which each correspond to one of the switches in the successive approximation register 7, the comparator 6, and the input selection circuit 14, and data specifying the ON/OFF state of each switch is set in the corresponding bit. In the example shown in the figure, a bit b0 corresponds to the switch 18, bit b1 to the switch 19, bit b2 to the switch 4, bit b3 to the switch 5, bit 4 to the switch 3, bit b5 to the switch 12, and bit b6 to the switch 13, and a bit b7 is not in use.

Next, description will be made of the operation of the A/D converter according to the seventh embodiment.

Referring to the block diagram in FIG. 1, before starting A/D conversion operation, lines of a high impedance are charged beforehand. Lines to be charged are determined by controlling the ON/OFF state of each switch according to the contents of the wiring connection selection register 22. It should be noted that setting data in the wiring connection selection register 22 can be carried out by using, for example, a method in which an address of a microcomputer is assigned to the wiring connection selection register 22 and the address is specified by the microcomputer to set data of 8 bits as in the case of setting data in the t1 control register 20 and the t2 control register 21 in the fifth embodiment, The A/D control circuit 15 reads out data set in this wiring connection selection register 22 to control the ON/OFF state of each switch. Here, it is assumed that in the wiring connection selection register 22, the bits b0, b2 and b3 are set to "1" while the bits b1, b4, b5, and b6 are set to "0". Upon reading such data, the A/D control circuit 15 turns ON the switches 18, 3, and 5, and turns OFF the switches 19, 3, 12, and 13. With this setting, it is possible to charge the line L2 by a comparison voltage determined based on the contents of the first A/D register 16 as described in the third embodiment. It should be noted that other basic operations are the same as those of the first embodiment.

As describe above, in the seventh embodiment, each selected line can be charged before starting A/D conversion, making it possible to increase the operational speed of A/D conversion for a low impedance input, and to take a charging time for high impedance wiring to improve the accuracy, realizing suitable conversion speed and accuracy of A/D conversion.

What is claimed is:

1. An A/D converter comprising:
   an input selection circuit for sequentially selecting a plurality of A/D inputs, and outputting one of the plurality of A/D inputs;
   a comparator having a capacitor for holding an A/D input voltage output from said input selection circuit for a certain period of time, said comparator comparing the voltage with a comparison voltage;
   a successive approximation register having A/D registers each corresponding to one of said A/D inputs for holding A/D conversion values based on comparison results by said comparator;
   a decoder for outputting said comparison voltage obtained by D/A converting a value held by said successive approximation register; and
   an A/D control circuit for switching an ON/OFF state of respective switches provided in said input selection circuit, said comparator, and said successive approximation register, and initially charging the capacitor in said comparator by a voltage determined based on the value held by either of said A/D register corresponding to an A/D input to be A/D converted before controlling A/D conversion of the A/D input.

2. The A/D converter according to claim 1, wherein each A/D register in the successive approximation register stores a previous A/D conversion value of a corresponding A/D input, and
   the A/D control circuit charges the capacitor in the comparator by a voltage corresponding to the previous A/D conversion value of said A/D input before controlling current A/D conversion of the A/D input.

3. The A/D converter according to claim 1, wherein each A/D register in the successive approximation register stores a voltage value equal to half of a reference voltage to generate a comparison voltage, beforehand, and
   the A/D control circuit charges the capacitor in the comparator by the voltage equal to half of said reference voltage before controlling first A/D conversion of the A/D input.

4. The AD converter according to claim 1, wherein when the A/D control circuit charges the capacitor in the comparator by the comparison voltage from the decoder, parasitic capacitances are also charged by the voltage.

5. The A/D.converter according to claim 1, wherein the A/D control circuit charges the capacitor in the comparator by an A/D input voltage output from the input selection circuit a predetermined period of timed before initiating A/D conversion of the A/D inputs.

6. The A/D converter according to claim 5, wherein a time adjustment register is provided to set a time period from the time when the capacitor in the comparator has been charged by the A/D input voltage output from the input selection circuit, to the initiation of A/D conversion of the A/D input, and
   the A/D control circuit charges said capacitor by said A/D input voltage a predetermined period of time before initiating A/D conversion of the A/D input, said predetermined period of time being read from said time adjustment register.

7. The A/D converter according to claim 1, wherein the A/D control circuit initiates A/D conversion of an A/D input after charging parasitic capacitances by a voltage determined based on a value held in a corresponding A/D register.

8. The A/D converter according to claim 1, wherein a wiring connection selection register is provided to set an ON/OFF state of each switch in the input selection circuit, the comparator, and the successive approximation register, and
   the A/D control circuit controls the ON/OFF state of said each switch according to contents of said wiring connection selection register, and charges a wiring obtained as a result of the control before initiating A/D conversion of the. A/D input.

9. An A/D converter comprising:
   an input selection circuit for sequentially selecting a plurality of A/D inputs, and outputting one of the plurality of A/D inputs;
   a comparator having a capacitor for holding an A/D input voltage output from said input selection circuit for a certain period of time, said comparator comparing the voltage with a comparison voltage;
   a successive approximation register having A/D registers each corresponding to one of said A/D inputs for holding A/D conversion values based on comparison results by said comparator;
   a decoder for outputting said comparison voltage obtained by D/A converting a value held by said successive approximation register; and
   the A/D control circuit initially charges the capacitor in the comparator by a voltage corresponding to the previous A/D conversion value of said A/D input before controlling current A/D conversion of the A/D input.

10. An A/D converter comprising:
    an input selection circuit for sequentially selecting a plurality of A/D inputs, and outputting one of the plurality of A/D inputs;

a comparator having a capacitor for holding an A/D input voltage output from said input selection circuit for a certain period of time, said comparator comparing the voltage with a comparison voltage;

a successive approximation register having A/D registers each corresponding to one of said A/D inputs for holding A/D conversion values based on comparison results by said comparator;

a decoder for outputting said comparison voltage obtained by D/A converting a value held by said successive approximation register; and the A/D control circuit initially charges the capacitor in the comparator by the voltage equal to half of said reference voltage before controlling first A/D conversion of the A/D input.

11. An A/D converter comprising:

an input selection circuit for sequentially selecting a plurality of A/D inputs, and outputting one of the plurality of A/D inputs;

a comparator having a capacitor for holding an A/D input voltage output from said input selection circuit for a certain period of time, said comparator comparing the voltage with a comparison voltage;

a successive approximation register having A/D registers each corresponding to one of said A/D inputs for holding A/D conversion values based on comparison results by said comparator;

a decoder for outputting said comparison voltage obtained by D/A converting a value held by said successive approximation register; and a time adjustment register provided to set a time period from the time when the capacitor in the comparator has been charged by the A/D input voltage output from the input selection circuit, to the initiation of A/D conversion of the A/D input; and the A/D control circuit initially charges said capacitor by said A/D input voltage a predetermined period of time before initiating A/D conversion of the A/D input, said predetermined period of time being read from said time adjustment register.

* * * * *